(12) United States Patent
Hanahara et al.

(10) Patent No.: US 6,482,490 B1
(45) Date of Patent: Nov. 19, 2002

(54) PRINTING SHEET WITH BASE MATERIAL, AND METHOD OF MANUFACTURING THE SAME

(75) Inventors: Tetsuro Hanahara, Fukui (JP); Kenji Inoue, Osaka (JP); Masahiko Asano, Fukui (JP); Shinji Okuma, Fukui (JP); Yoshiharu Abe, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/500,797

(22) Filed: Feb. 10, 2000

(30) Foreign Application Priority Data

Feb. 10, 1999 (JP) .............................................. 11-032397

(51) Int. Cl.⁷ ............................ B32B 33/00; B32B 9/00
(52) U.S. Cl. ....................... 428/40.1; 428/42.2; 428/43; 428/195; 428/914
(58) Field of Search ............................... 428/40.1, 42.2, 428/43, 195, 914

(56) References Cited

U.S. PATENT DOCUMENTS 4,098,935 A * 7/1978 Knudsen ...................... 428/40
5,582,086 A 12/1996 Kogame
5,721,178 A * 2/1998 Lalande ........................ 442/59
6,187,405 B1 * 2/2001 Rudin .......................... 428/43

* cited by examiner

Primary Examiner—Bruce H. Hess
Assistant Examiner—B. Shewareged
(74) Attorney, Agent, or Firm—McDermott, Will & Emery

(57) ABSTRACT

A printing sheet can be easily peeled from a base film. A printing sheet can be easily and efficiently mounted on an appliance. It includes a base film as a base material, an adhesive applied on the surface of the base material, and a main body film adhered to the base material through the adhesive. The main body film may be peeled from the adhesive and base material. The main body film has a plurality of printing sheets, and each printing sheet of the printing sheets has a half-cut portion cutting off only the printing sheet without cutting off the base material, so that each printing sheet may be peeled from the adhesive and base material. Preferably, the base film has a greater thickness than the main body film. The half-cut portion has an end portion in a state being lifted from the base material having the adhesive.

24 Claims, 6 Drawing Sheets

PRINTING SHEET WITH BASE MATERIAL, AND METHOD OF MANUFACTURING THE SAME

FIELD OF THE INVENTION

The present invention relates to a printing sheet with base material, and a method of manufacturing the same.

BACKGROUND OF THE INVENTION

An electronic appliance is composed of wiring boards, electroluminescence elements, panel sheets, and other components, and these components are supplied as printing sheets. Recently, as the electronic appliances are advanced in function and diversified in display, the components contained in such electronic appliances are printed by using printing sheets of 50 µm or less in thickness and having an excellent folding property. Such thin printing sheets are stored and conveyed in a state adhered to a base film in order to prevent damage in handling. Immediately before mounting on electronic appliances, the printing sheets are peeled from the base film and used.

Such conventional printing sheet with base film is explained by referring to FIG. 8 and FIG. 9.

For the ease of understanding of the composition, the drawings are shown by magnifying the dimension in the thickness direction.

FIG. 8 is a sectional view of a conventional printing sheet with base film. In FIG. 8, a printing sheet with base film 4 has a base film 2, and a printing sheet 1 glued on the top of the base film 2 with a weak adhesive 3. The printing sheet 1 is made of a resin having an excellent folding property such as polyethylene terephthalate or polyimide, and has a thickness of about 25 µm. The base film 2 is made of a resin such as polyethylene terephthalate or polyimide, and has a thickness of about 100 µm in a same shape as the printing sheet 1. On the top of the printing sheet 1, a plurality of conductive layers, insulating layers, patterns, figures and others (not shown) are printed and formed.

A method of manufacturing the printing sheet with base film having such composition is described below by referring to FIG. 8. FIG. 9 is a drawing explaining a manufacturing process of such conventional printing sheet with base film. As shown in FIG. 9(a), a large main body film 5 having a plurality of printing sheets 1 is prepared. Next, a weak adhesive 7 is applied on the top of the large base film 6 of about 100 µm in thickness. They are adhered to the top of the base film 6 through the weak adhesive 7 of about 25 µm in thickness. Thus, a composite sheet 8 is prepared. On the top of the large main body film 5 of this composite sheet 8, a plurality of conductive layers, insulating layers, patterns, figures and others (not shown) are printed.

Later, as shown in FIG. 9(b), by blanking the composite sheet 8 having the main body film 5 and base film 6 and processing into a specified shape, individual printing sheets with base film 4 are completed.

The printing sheet 1 adhered to such base film 2 is stored and conveyed in a state of a printing sheet with base film 4. This printing sheet with base film 4 is peeled from the base film 2 immediately before being mounted on an electronic appliance, and is used.

In such conventional printing sheet with base film, however, the printing sheet with base film 4 is one individual piece, and the outline of the printing sheet 1 has the same shape as the outline of the base film 2. Accordingly, when mounting the printing sheet on the appliance, it is hard to peel the printing sheet 1 from the base film 2, and it takes a long time to mount the printing sheet on the appliance.

It is hence an object of the invention to present a printing sheet with base material capable of peeling the printing sheet easily from the base material, and improving the working efficiency when mounting on the appliance, and a method of manufacturing the same.

SUMMARY OF THE INVENTION

The printing sheet with base material of the invention comprises:
  a base material,
  an adhesive applied on the surface of the base material, and
  a main body film adhered on the base material through the adhesive.

The main body film may be peeled from the adhesive and base material, the main body film has a plurality of printing sheets, each printing sheet of the printing sheets has a half-cut portion cutting off only the printing sheet without cutting off the base material, and each printing sheet may be peeled from the adhesive and base material.

The manufacturing method of printing sheet with base material of the invention comprises:
  (a) a step of applying an adhesive to the surface of a base material,
  (b) a step of adhering a main body film to the surface of the base material through the adhesive,
  (c) a step of forming a plurality of printing sheets having a plurality of printing portions on the surface of the main body film, and
  (d) a step of forming a half-cut portion in the main body film adhered to the base material.

Each printing sheet of the plurality of printing sheets is formed so as to may be peeled from the adhesive and base material, and each printing sheet may be peeled from the half-cut portion.

Preferably, the base material has a base film, and the base film has a greater thickness than the main body film.

Preferably, the half-cut portion is formed around each printing sheet.

Preferably, the adhesive has a weak adhesion so that only each printing sheet may be peeled from the base material.

Preferably, the half-cut portion has an end portion lifted from the base material having the adhesive.

Preferably, both the base material and main body film have a band shape.

Preferably, the half-cut portion has a specified thickness formed by laser processing.

In this constitution, the printing sheet may be easily peeled from the base film, and the printing sheet can be easily mounted on the appliance.

Figure 1:
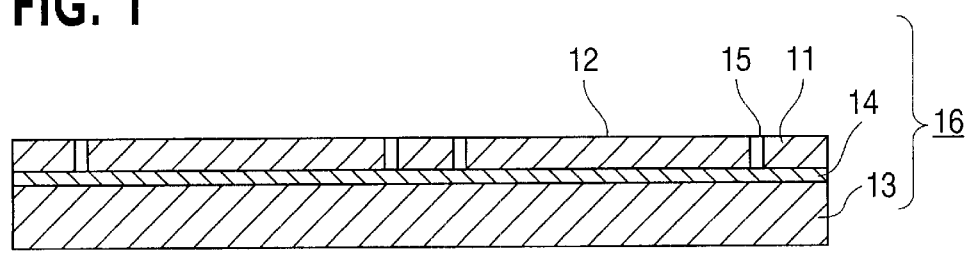
FIG. 1 is a sectional view of a printing sheet with base material according to an embodiment of the invention.

REFERENCE NUMERALS 11, 11A, 11B Main body film
12, 12A Printing sheet
13, 13A Base film
14 Weak adhesive
15, 15A Half-cut
16, 16A Printing sheet with base film
17 Roller

DETAILED DESCRIPTION OF THE INVENTION

A printing sheet with base film in an embodiment of the invention comprises:
 a base film as a base material,
 an adhesive applied on the surface of the base film, and
 a main body film separably adhered on the adhesive.

The main body film has a plurality of printing sheets. The adhesive has a weak adhesion. The outer periphery of each printing sheet of the plurality of printing sheets has a half-cut portion having a cut-off main body film and an uncut base film. Each printing sheet may be peeled from the base film having the adhesive, not being accompanied by the adhesive, by holding the periphery of the half-cut portion. That is, the peeled printing sheet does not have the adhesive. The adhesive is left over on the surface of the base film, in a state being adhered to the surface of the base film.

In this constitution, since the half-cut portion is formed along the outer periphery of each printing sheet, by bending the base film, each printing sheet can be easily peeled from the base film. As a result, the peeled printing sheet can be easily mounted on the appliance.

Preferably, the half-cut portion of the outer periphery of each printing sheet of the main body film is formed by laser processing. Since the half-cut portion of the outer periphery of each printing sheet is processed by laser beam, the depth and width of the half-cut portion can be properly selected by adjusting the intensity of the laser beam depending on the material or thickness of the main body film.

Preferably, the main body film and base film have a band shape, and a plurality of printing sheets are continuously formed on the main body film. Since the printing sheets are continuously formed on the band-shaped main body film, manufacture of printing sheets and mounting job on electronic appliances can be done continuously and efficiently.

A manufacturing method of printing sheet with base material in an embodiment of the invention comprises:
 a step of adhering a main body film to a base film as a base material,
 a step of printing a plurality of printing sheets on the main body film, and
 a step of forming a half-cut portion on the outer periphery of each printing sheet of the main body film.

In this constitution, each printing sheet may be easily peeled from the base film. Moreover, the printing sheet with base film can be manufactured easily.

Preferably, the manufacturing method further includes a step of lifting the outer periphery of each printing sheet from the base film by bending the half-cut portion after forming the half-cut portion. In this constitution, since the outer periphery of each printing sheet is loose and separate from the base film, if the printing sheet with base film is put on a flat plane, the printing sheet can be easily peeled from the base film.

Exemplary embodiments of the invention are described below while referring to FIG. 1 to FIG. 7.

For the ease of understanding of the composition, the drawings are shown by magnifying the dimension in the thickness direction. The same constituent elements as in the prior art constitution are identified with same reference numerals and detailed description is omitted.

EXEMPLARY EMBODIMENT 1

Figure 2:
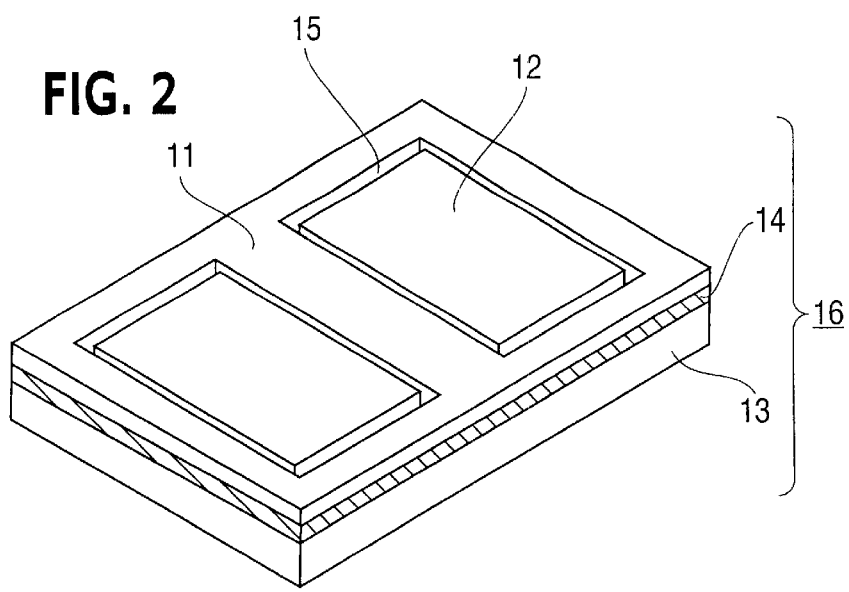
FIG. 2 is a perspective view of the printing sheet with base material shown in FIG. 1.

FIG. 1 is a sectional view of a printing sheet with base material according to an embodiment of the invention, and FIG. 2 is a perspective view of the printing sheet with base material shown in FIG. 1. In FIG. 1 and FIG. 2, a printing sheet with base film 16 includes a base film 13 as a base material, an adhesive 14 applied on the base film 13, and a main body film 11 adhered on the base film 13 by means of the adhesive 14. The main body film 11 is adhered separably from the base film 13. The main body film 11 has a plurality of printed printing sheets 12. Each printing sheet of the plurality of printing sheet 12 has printed forms of conductive layers, insulating layers, patterns, figures and others (not shown).

The main body film 11 is made of a resin such as polyethylene terephthalate or polyimide, and has a thin thickness of about 25 $\mu$m. The main body film 11 has an excellent folding property. The base film 13 is made of a resin such as polyethylene terephthalate or polyimide, and has a thin thickness of about 100 $\mu$m. The base film 13 has a same shape as the main body film 11. The adhesive 14 has a weak adhesion. That is, the adhesive 14 has such a weak adhesion that only the main body film adhered to this weak adhesive may be separated.

The half-cut portion 15 is formed on the outer periphery of each printing sheet of the plurality of printing sheets 12. The half-cut portion 15 has a cut-off main body film portion and an uncut base film portion. The half-cut portion 15 is formed by cutting off only the main body film 11, by laser processing, without cutting-off the base film 13. Thus, the printing sheet with base film 16 is composed.

A manufacturing method of thus composed printing sheet with base film 16 is described below.

Figure 3:
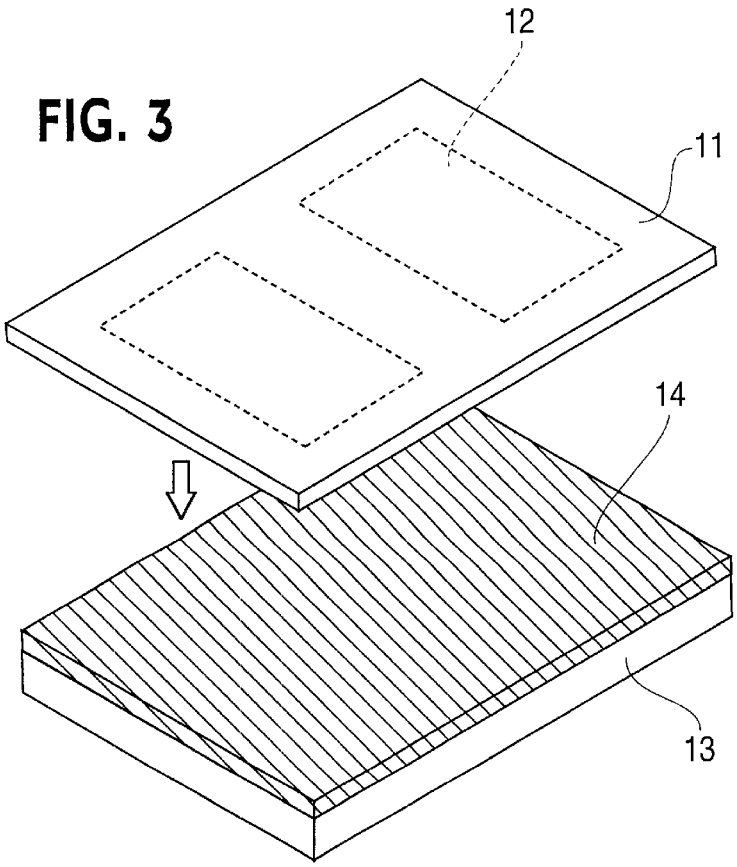
FIG. 3 is a perspective view explaining a manufacturing method of printing sheet with base material according to an embodiment of the invention.

Since the main body film 11 has a thin thickness of about 25 $\mu$m, it is likely to be damaged, and it is difficult to print on the film surface. To solve this problem, as shown in FIG. 3, an adhesive 14 was applied on the top of the base film 13 having a thickness of about 100 $\mu$m. Then, the main body film 11 was adhered on the adhesive 14 applied on the top of the base film 13. The specified plurality of printed forms were formed on the top of the main body film 11 adhered to the base film 13. The half-cut portion 15 was formed on the outer periphery of each printing sheet of the plurality of printing sheets 12. The half-cut portion 15 has a cut-off main body film portion and an uncut base film portion. The half-cut portion 15 is formed by cutting off only the main body film, by laser processing, without cutting off the base film. Thus, the printing sheet with base film 16 was completed.

The half-cut portion 15 can be also formed by press processing with a Thomson cutter or the like. In the case of this press processing, it requires fabrication of new die or adjustment of equipment depending on the material or thickness of the main body film 11, or depth or width of the half-cut portion.

The printing sheet 12 adhered to such base film 13 is stored or conveyed in a state of printing sheet with base film 16 in order to prevent damage. Immediately before the printing sheet 12 is mounted on an electronic appliance, each printing sheet 12 is peeled from the base film 13, and the peeled printing sheet is mounted on the electronic appliance.

Each printing sheet 12 can be peeled from the base film 13 having the adhesive 14, not being accompanied by the adhesive 14, by holding the periphery of the half-cut portion 15. That is, the peeled printing sheet 12 does not have the adhesive 14. The adhesive 14 is left over on the surface of the base film 13, in a state being adhered to the surface of the base film 13.

Figure 4:
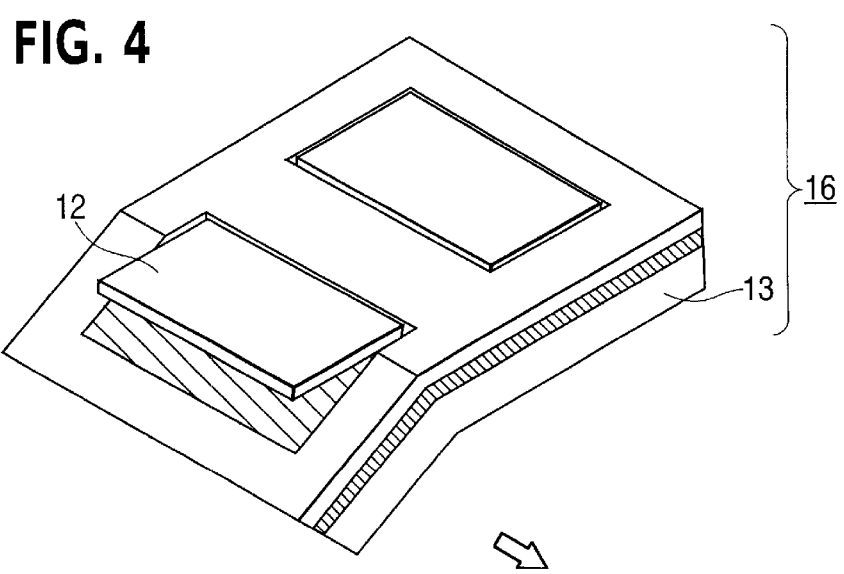
FIG. 4 is a perspective view showing a peeling state of the printing sheet with base material according to the embodiment of the invention.

When peeling this printing sheet 12 from the base film 13, the printing sheet with base film 16 is composed so that the printing sheet 12 may be easily peeled from the base film 13 by applying a bending force on the base film 13 in a downward direction as shown in FIG. 4.

In this way, the plurality of printing sheets 12 are formed on the main body film 11, and the half-cut portion 15 is formed on the outer periphery of each printing sheet 12, and therefore by applying a bending force to the base film 13, the printing sheet 12 can be easily peeled from the base film 13.

Since the half-cut portion 15 is processed by laser beam, the depth and width of the half-cut portion can be properly selected by adjusting the intensity of the laser beam depending on the material or thickness of the printing sheet 12. As a result, only the main body film 11 can be cut off without cutting the base film 13.

EXEMPLARY EMBODIMENT 2

Figure 5:
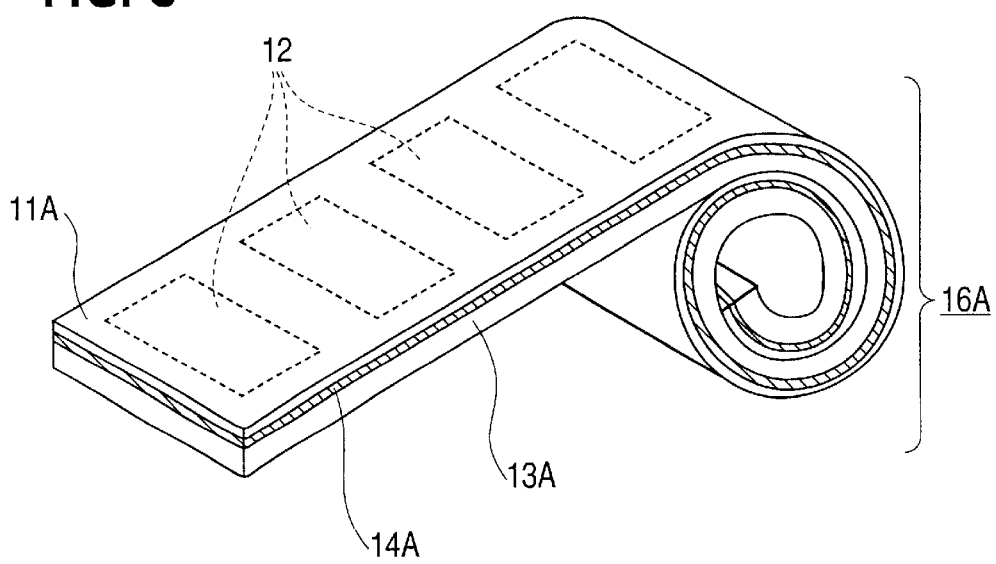
FIG. 5 is a perspective view of a printing sheet which can be peeled from a band-shaped base material in the printing sheet with base material according to the embodiment of the invention.

In other embodiment of the printing sheet with base material as shown in FIG. 5, it is possible to use a printing sheet with base film 16A having a band-shaped base film 13A, and a band-shaped main body film 12A adhered to the band-shaped base film 13A with adhesive 14A. On the surface of this band-shaped main body film 12A, a plurality of printing sheets 12 are formed. In such printing sheet with base film 16A, each printing sheet can be easily peeled from the base film, and the manufacturing efficiency of printing sheets is extremely improved. Moreover, the mounting work of printing sheets on electronic appliances can be done continuously and efficiently.

EXEMPLARY EMBODIMENT 3

Figure 6A:
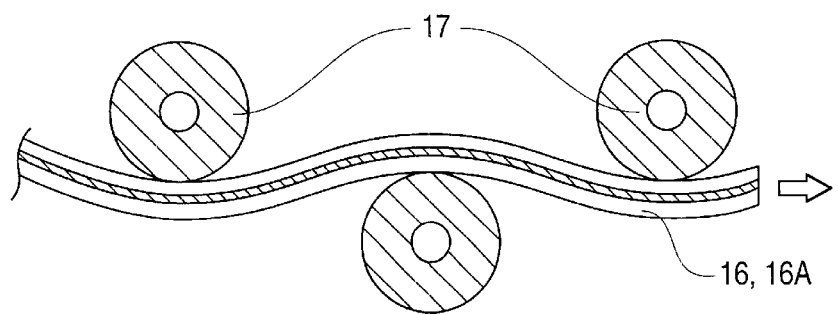
FIG. 6 is a sectional view showing a printing sheet having a loosened outer periphery in the printing sheet with base material according to the embodiment of the invention.
Figure 6A:
Figure 6B:
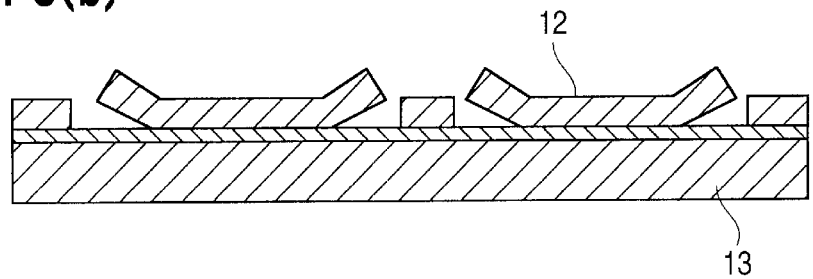

Further, as shown in FIG. 6(a), by applying a bending force to the half-cut portion through a plurality of rollers 17 having printing sheets with base film 16 or band-shaped printing sheets with base film 16A on the upper and lower surfaces, the outer peripheral end of each printing sheet 12 can be lifted from the base film 13 as shown in FIG. 6(b). In such constitution, if the printing sheet with base film 16 is put on a flat plane, the printing sheet can be easily separated from the base film.

EXEMPLARY EMBODIMENT 4

Figure 7:
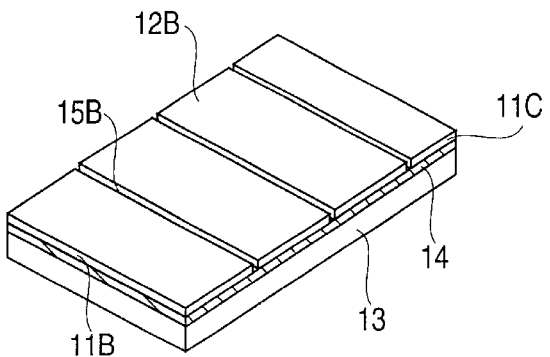
FIG. 7 is a perspective view of a printing sheet with base material according to other embodiment of the invention.
Figure 8:
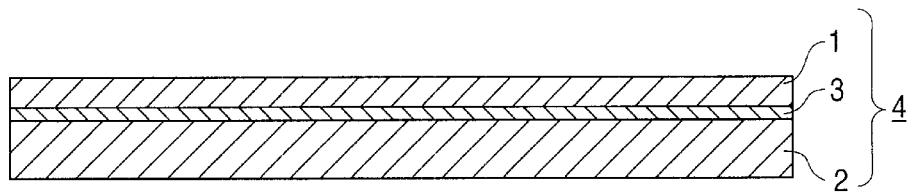
FIG. 8 is a sectional view of a printing sheet with base film in a prior art.
Figure 9A:
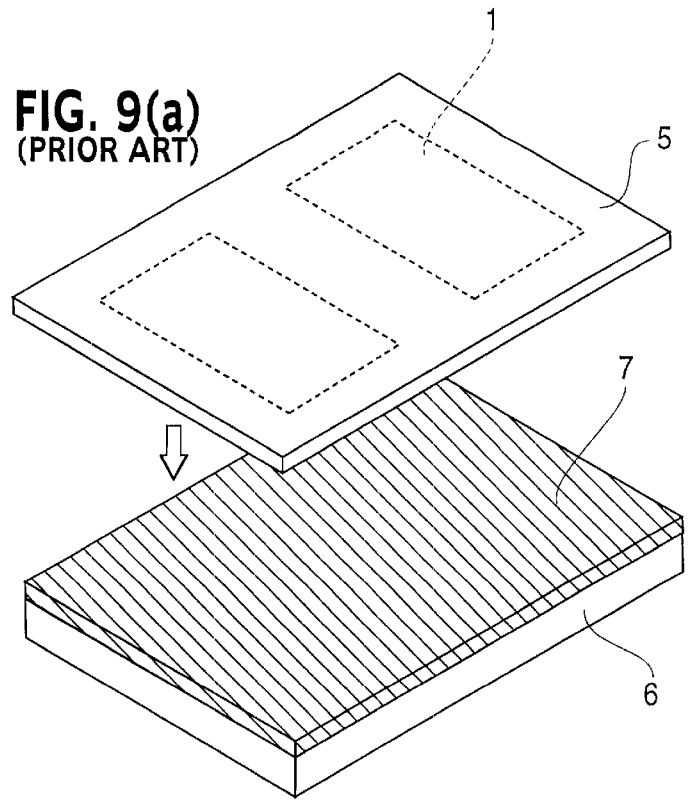
FIG. 9 is a perspective view showing a manufacturing method of printing sheet with base film in a prior art.
Figure 9B:
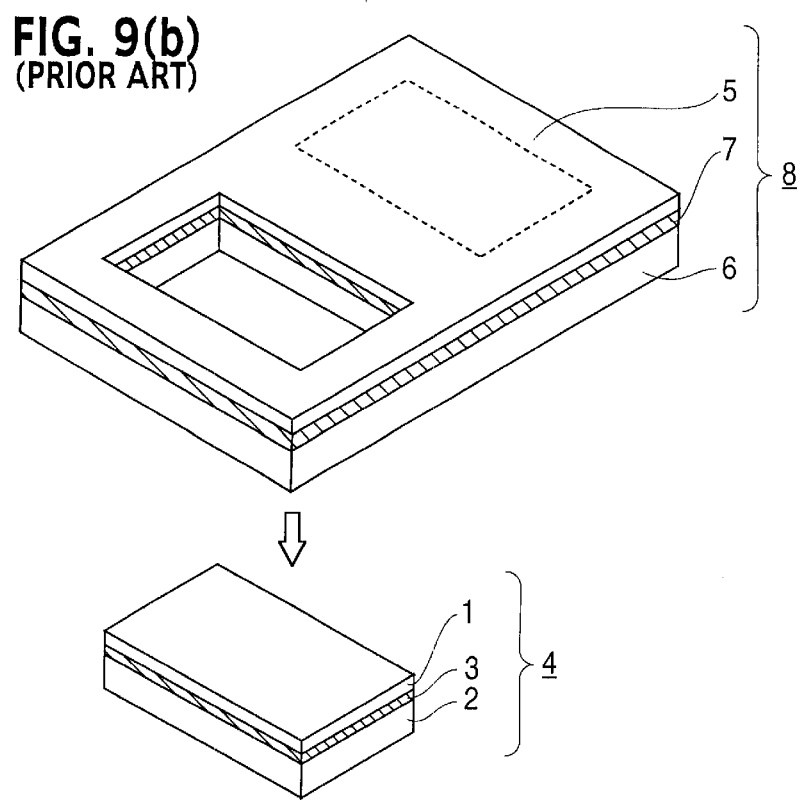

The printing sheet with base film of the embodiment has a printing sheet 12 formed in the middle of the main body film 11 and the half-cut portion 15 formed on the outer periphery of this printing sheet 12, but not limited to this composition, it is also possible to use a composition as shown in FIG. 7. That is, in FIG. 7, the printing sheet with base film has a base film 13, and a main body film 11B adhered to the base film 13 by the use of an adhesive 14. The main body film 11B has a same width as the base film 13. The main body film 11B has a plurality of printed printing sheets 12B. The outer periphery of each printing sheet 12B of the plurality of printing sheets 11B has a side coinciding with the side 11C in the width direction of the main body film 11B, and the half-cut portion 15B. The half-cut portion 15B has a cut-off main body film portion, and an uncut base film portion.

In this constitution, the same effects as in exemplary embodiment 1 are obtained.

According to the invention, as described herein, the printing sheet can be easily peeled from the base film. The printing sheets with base film having such easy peeling property can be manufactured easily. The printing sheets can be easily and efficiently mounted on the appliances. Printing sheets not damaged during storage or conveyance may be obtained. A plurality of printed forms can be formed easily without damage. Printing sheets with base film having all these effects can be obtained.

What is claimed is:

1. A printing sheet with base material comprising:
   a base material,
   an adhesive applied on a surface of said base material, and
   a main body film adhered on said base material through said adhesive, said main body film may be peeled from said adhesive and base material, said main body film including a plurality of printing sheets, each printing sheet of said plurality of printing sheets including a half-cut portion cutting off only said printing sheet without cutting off said base material and said adhesive, said each printing sheet may be peeled from said adhesive and said base material, and said printing sheets once removed do not have adhesive on the back surface thereof,
   wherein said main body film comprises electronic components disposed thereon.

2. The printing sheet of claim 1, wherein said base material has a base film, and said base film has a greater thickness than said main body film.

3. The printing sheet of claim 1, wherein said half-cut portion is formed around each printing sheet.

4. The printing sheet of claim 1, wherein said adhesive has a weak adhesion so that only the main body film may be peeled from said base material.

5. The printing sheet of claim 1, wherein said half-cut portion is formed so as to extend across the entire width of the main body film.

6. The printing sheet of claim 1, wherein said half-cut portion has a specified thickness formed by laser processing.

7. The printing sheet of claim 1, wherein said half-cut portion has an end portion lifted from said base material having said adhesive.

8. The printing sheet of claim 1, wherein said adhesive has a weak adhesion so that the end portion of each printing sheet may be lifted by applying a bending force to said half-cut portion.

9. The printing sheet of claim 1, wherein said base material has a band shape, and said main body film has a band shape.

10. The printing sheet of claim 1,
    wherein said base material has a base film, said base film has a greater thickness than said main body film, said half-cut portion is formed on an outer periphery of each printing sheet, and said adhesive has a weak adhesion so that only the printing film may be peeled from said base material.

11. A printing sheet with base material comprising:

a band-shaped base material, an adhesive applied on a surface of said base material, and a band-shaped main body film adhered on said base material through said adhesive, said main body film may be peeled from said adhesive and base material, said main body film including a plurality of printing sheets, each printing sheet of said plurality of printing sheets including a half-cut portion cutting off only said printing sheet without cutting off said base material and said adhesive, said each printing sheet may be peeled from said adhesive and said base material, and said printing sheets once removed do not have adhesive on the back surface thereof, wherein said band-shaped main body film comprises electronic components disposed thereon.

12. The printing sheet of claim 11, wherein said base material has a base film, and said base film has a greater thickness than said main body film.

13. The printing sheet of claim 11, wherein said half-cut portion is formed on a whole periphery of each printing sheet.

14. The printing sheet of claim 11, wherein said adhesive has a weak adhesion so that only the main body film may be peeled from said base material.

15. The printing sheet of claim 11, wherein said half-cut portion is formed at a position linking from a first longer side of the band shape said main body film to a second longer side opposite to said first longer side.

16. The printing sheet of claim 11, wherein said half-cut portion has an end portion lifted from said base material having said adhesive.

17. A printing sheet with base material comprising:

a base material, an adhesive applied on a surface of said base material, and a main body film adhered on said base material through said adhesive, said main body film may be peeled from said adhesive and base material, said main body film including a plurality of printing sheets, each printing sheet of said plurality of printing sheets including a half-cut portion cutting off only said printing sheet without cutting off said base material and said adhesive, said each printing sheet may be peeled from said adhesive and said base material, and said printing sheets once removed do not have adhesive on the back surface thereof, wherein said half-cut portion is a channel portion.

18. The printing sheet of claim 17, wherein said base material has a base film, and said base film has a greater thickness than said main body film.

19. The printing sheet of claim 17, wherein said half-cut portion is formed around each printing sheet.

20. The printing sheet of claim 17, wherein said main body film comprises electronic components disposed thereon.

21. A printing sheet with base material comprising:

a band-shaped base material, an adhesive applied on a surface of said base material, and a band-shaped main body film adhered on said base material through said adhesive, said main body film may be peeled from said adhesive and base material, said main body film including a plurality of printing sheets, each printing sheet of said plurality of printing sheets including a half-cut portion cutting off only said printing sheet without cutting off said base material and said adhesive, said each printing sheet may be peeled from said adhesive and said base material, and said printing sheets once removed do not have adhesive on the back surface thereof, wherein said half-cut portion is a channel portion.

22. The printing sheet of claim 21, wherein said base material has a base film, and said base film has a greater thickness than said main body film.

23. The printing sheet of claim 21, wherein said half-cut portion is formed on a whole periphery of each printing sheet.

24. The printing sheet of claim 21, wherein said main body film comprises electronic components disposed thereon.

* * * * *